(12) United States Patent
Suzuki

(10) Patent No.: US 11,201,574 B2
(45) Date of Patent: Dec. 14, 2021

(54) METHOD FOR DETECTING MAGNETIC FIELD LOCATION IN ELECTRIC MOTOR

(71) Applicant: SHINANO KENSHI KABUSHIKI KAISHA, Nagano (JP)

(72) Inventor: Kazuki Suzuki, Nagano (JP)

(73) Assignee: SHINANO KENSHI KABUSHIKI KAISHA, Nagano (JP)

( * ) Notice: Subject to any disclaimer, the term of this patent is extended or adjusted under 35 U.S.C. 154(b) by 37 days.

(21) Appl. No.: 16/927,545

(22) Filed: Jul. 13, 2020

(65) Prior Publication Data

US 2021/0126564 A1    Apr. 29, 2021

(30) Foreign Application Priority Data

Oct. 29, 2019  (JP) .............................. JP2019-195906

(51) Int. Cl.
| | |
|---|---|
| *H02P 6/182* | (2016.01) |
| *H02P 27/08* | (2006.01) |
| *H02K 1/27* | (2006.01) |
| *G01R 19/04* | (2006.01) |
| *H02P 23/14* | (2006.01) |

(52) U.S. Cl.
CPC .............. *H02P 6/182* (2013.01); *G01R 19/04* (2013.01); *H02K 1/27* (2013.01); *H02P 23/14* (2013.01); *H02P 27/08* (2013.01)

(58) Field of Classification Search
CPC .......... H02P 6/182; H02P 27/08; H02P 23/14; H02P 2203/03; H02P 6/186; H02K 1/27; H02K 11/27
USPC .................. 318/400.34, 400.32, 400.01, 700
See application file for complete search history.

(56) References Cited

U.S. PATENT DOCUMENTS 7,898,197 B2 *   3/2011   Tomigashi .............. H02P 21/10
                                                        318/400.02

FOREIGN PATENT DOCUMENTS

JP          2018078695         5/2018

* cited by examiner

*Primary Examiner* — David Luo
(74) *Attorney, Agent, or Firm* — Stephen J. Weyer, Esq.; Stites & Harbison, PLLC

(57) ABSTRACT

An MPU sequentially selects one from six energization patterns, applies constant voltage rectangular pulses to the three-phase coils for a prescribed sensing energization time, turns on at least the low-side arm of the three-phase half-bridge type inverter circuit so as to reflux an induced current between a switching element and the coils and attenuate the same, measures peak coil current values immediate before completing the sensing energization by an A/D-converter circuit, and stores the peak coil current values as measured data.

3 Claims, 10 Drawing Sheets

METHOD FOR DETECTING MAGNETIC FIELD LOCATION IN ELECTRIC MOTOR

CROSS-REFERENCE TO RELATED APPLICATION

This application is based upon and claims the benefit of priority of prior Japanese Patent Application No. 2019-195906, filed on Oct. 29, 2019, and the entire contents of which are incorporated herein by reference.

TECHNICAL FIELD

The present invention relates to a method for detecting a magnetic field location in an electric motor, e.g., sensorless motor, linear actuator.

BACKGROUND ART

Conventionally, DC motors having brushes have been used as small DC motors, but they have problems of brush noise, electric noise, low durability, etc., so brushless DC motors have been developed to solve the problems. These days, sensorless motors, which have no location sensors, draw attention as compact, light, tough and low-cost motors, and they were firstly employed in information technology devices, e.g., hard disk drive unit, and then employed in home electric appliances, car-mounted devices, etc. due to progression of vector control technology.

A three-phase brushless direct current (DC) motor is shown in FIG. 8 as an example of a sensorless motor having no location sensor. A rotor 2 is capable of rotating about a rotor shaft 1 and has a permanent magnet 3 having a pair of magnetic poles, i.e., S-pole and N-pole. A type of magnetic pole structure (IPM, SPM) and number of magnetic poles may be optionally selected. In a stator 4, armature coils (coils) U, V and W are formed on pole teeth, which are provided with a phase difference of 120°, and they are star-connected through a neutral point (common point) C.

An example of a block diagram of a conventional sensorless drive circuit is shown in FIG. 11. MOTOR sands for a three-phase sensorless motor. An MPU (microprocessor) 51 is a microcontroller (control means). An INV 53 is an inverter circuit (output means) having a three-phase half-bridge structure. RS stands for an electric current sensor 54. ADC stands for an A/D converter for converting an electric current value into a digital value. Note that, the actual circuit further includes an electric source, a zero-cross comparator, a dummy common generating part, a host interface part, etc., but they are omitted for easy explanation.

A timing chart of a typical example of 120°-energization for driving the three-phase DC brushless motor is shown in FIG. 12. In an interval 1, rectangular-wave energization is performed from the U-phase to the V-phase; in an interval 2, rectangular-wave energization is performed from the U-phase to the W-phase; in an interval 3, rectangular-wave energization is performed from the V-phase to the W-phase; in an interval 4, rectangular-wave energization is performed from the V-phase to the U-phase; in an interval 5, rectangular-wave energization is performed from the W-phase to the U-phase; and in an interval 6, rectangular-wave energization is performed from the W-phase to the V-phase. Dotted lines are waveforms of induced voltages. HU to HW are waveforms of outputs of hall sensors provided in the motor, and excitation-switching in the conventional brushless DC motor having the location sensor is performed according to these signals.

In the sensorless driving manner, locations of the rotor are detected from the induced voltages, but the rotor cannot be initiated when a speed is zero because no voltages are induced in a stationary state and the location of the rotor cannot be detected. To detect the location of the rotor in the stationary state, a detection method, in which an electric current detecting circuit including the current sensor 54 and the three-phase half-bridge type inverter circuit 53 are used and in which sine-wave coil currents are passed through coils by PWM driving manner so as to estimate the rotor location from current response, has been used.

In a high frequency wave applying manner in which sensing pulses, e.g., large current sine waves, are applied so as to estimate a rotor location from coil current profiles, three current sensors 54 and the high speed A/D converter 56 capable of simultaneously sampling three phases are required to make the current profiles. Further, a differential amplifier, etc. are required for precise measurement, so a detection circuit must be complex. To perform calculation for estimating the rotor location, mathematical model is used, so the high performance MPU 51 is required. Therefore, a production cost of an apparatus for performing this manner must be high. Further, there are problems of a large sensing current, a long location sensing time, e.g., several dozen msec, etc.

To solve the above described problems, a method for detecting a magnetic field location in an electric motor, in which a low-cost motor having simple hardware and software is used and the permanent magnetic field location can be detected quickly, has been proposed. In a stationary state of the motor, three-phase sensing pulses (constant voltage rectangular-wave pulses) are sequentially applied to three-phase coils, and an energization time of each coil to be an object phase is repeatedly measured, and the permanent magnetic field location is identified from magnetic field location information corresponding to an energization pattern whose measured data of the energization time is the minimum among measured data of six energization patterns (see Patent Literature 1: Japanese Laid-open Patent Publication No. 2018-78695).

SUMMARY OF INVENTION

Technical Problem

In the above described Patent Literature 1, the rotor location is detected in units of an electric angle of 60°, but a large electric current is applied, so variation of a power generated in the rotor, which is caused by rapid change of the electric current, rapidly occurs, and noises are generated.

FIG. 13 is a waveform chart showing a current waveform when applying one pulse voltage (a drive signal) to optional two coils of the three-phase coils by 120°-rectangular-wave energization and a noise waveform captured by a microphone. FIG. 14 is a waveform chart showing a microphone waveform, in which the noise waveform shown in FIG. 13 has been FFT (Fast Fourier Transformation)-treated. In FIG. 14, a vertical axis indicates magnitude of noise, and a horizontal axis is a time axis. According to FIG. 12, the noise is generated immediately after applying the pulse voltage.

In a motor driving circuit shown in FIG. 15, a solid line arrow shows a flow of an electric current passing through optional two coils (e.g., U-phase and V-phase) of the three-phase coils (U, V and W) when applying pulse voltage to the two coils, and a dotted line arrow shows a flow of an induced current generated after energization. According to the dotted line arrow, an electric power is consumed by existing reflux diodes and resistances, which are connected to FETs in parallel, in the flow path of the induced current, so attenuation of electric current progresses fast and noises are generated.

Solution to Problem

Embodiments described later are conducted to solve the above described problems, and an object is to provide a method for detecting magnetic field location in an electric motor, which is capable of restraining rapid change of an induced current in coils to reduce noises when detecting the magnetic field location of the electric motor.

To achieve the object, the method of the present invention is capable of detecting a magnetic field location in an electric motor, the electric motor comprises: a rotor having a permanent magnetic field; and a stator having three-phase coils and being initiated by 120°-rectangular wave energization of a constant-voltage DC electric source, the electric motor driving circuit further comprises:

control means for storing six energization patterns, which are forward-direction energizations and reverse-direction energizations for the three-phase coils, and field location information indicating excitation switching intervals of 120°-energization corresponding to the energization patterns, the control means including a PWM control circuit for generating PWM energization signals for the three-phase coils according to a rotation command from a superordinate controller;

output means for energizing optional two coils of the three-phase coils, through a three-phase half-bridge type inverter circuit, by the PWM control circuit;

current detecting means for detecting coil currents, the current detecting means being connected to an earth-side terminal of the output means; and an A/D-converter circuit for measuring coil current values from outputs of the current detecting means, the PWM control circuit controls each pair of a high-side arm and a low-side arm of the three-phase half-bridge type inverter circuit for each phase, and performs PWM control in a complementary mode, in which an opposite-side arm with respect to an energization time within a PWM cycle is turned on, during PWM-off cycles, the control means repeats:

an energization-off step, in which the control means blocks all outputs of the output means immediately before sensing energization to the three-phase coils, and releases energies stored in all of the coils so as to produce a coil current zero state;

a measurement step, in which the control means sequentially selects one from the six energization patterns as an object phase to be measured which is selected from the three-phase coils and in which one-phase energization is performed and no branch is formed at a neutral point, applies constant voltage rectangular pulses to the three-phase coils for a prescribed sensing energization time, turns on at least the low-side arm of the three-phase half-bridge type inverter circuit so as to reflux an induced current between a switching element and the coil and attenuate the same, measures peak coil current values immediate before completing the sensing energization by the A/D-converter circuit, and stores the measured peak coil current values as measured data;

a storing step, in which the control means selects a reverse-direction energization pattern after a forward-direction energization pattern for the object phase, then selects a forward-direction energization pattern and a reverse-direction energization pattern for the rest two phases, repeats measurement of peak coil current values generated by energization-off actions and sensing energizations for the six energization patterns, measures peak coil current values immediately before completing the sensing energizations, and stores the measured data, and the control means selects an energization pattern whose peak coil current value is the maximum among the measured data of the six energization patterns, and identifies a permanent magnetic field location from the field location information corresponding to the maximum energization pattern.

In the above described method, the stationary location of the permanent magnetic field can be quickly identified by sequentially applying three-phase sensing pulses (constant voltage rectangular-wave pulses) to the three-phase coils and measuring the peak coil current of the object phase to be measured. Especially, in the measurement step in which the sensing energization is performed by applying constant voltage rectangular-wave pulses to the three-phase coils, at least the low-side arm of the three-phase half-bridge type inverter circuit for reflux is turned on so as to reflux an induced current between a switching element (e.g. a field-effect transistor) and the coil and attenuate the induced current, so that rapid variation of the motor current and generation of noises can be restrained.

Preferably, in the measurement step, the control means applies constant voltage rectangular pulses, which have been divided by the PWM control circuit, to the object phase to be measured, when sequentially selecting one energization pattern from the six energization patterns and applying constant voltage rectangular pulses to the three-phase coils for the prescribed sensing energization time, and measures peak coil current values immediately before completing the sensing energizations by the A/D-converter circuit, and stores the measured peak coil current values as the measured data.

With this method, rapid variation of the motor current and generation of noises can be further restrained.

Preferably, the control means halves field location information of an electric angle of 60° identified from the maximum energization pattern, by magnitude-comparing the measure data of the energization patterns adjacent to the energization pattern whose peak coil current value is maximum, so as to identify the permanent magnetic field location in units of an electric angle of 30°.

With this method, a cross point of energization times of two coils exists at a center of an interval of the permanent magnetic field location information defined by an electric angle of 60°, and a magnitude relation is inverted, so that the rotor location can be precisely identified, at a pitch of an electric angle of 30°, by magnitude-comparing the measure data of the both energization patterns, adjacent to each other.

Advantageous Effects of Invention

By employing the method of the present invention, generating noises, which is generated when detecting the magnetic field location of the electric motor, can be restrained, so the quiet method for detecting a magnetic field location in an electric motor can be realized.

DESCRIPTION OF EMBODIMENTS

Embodiments of the method for detecting magnetic field locations of an electric motor relating to the present invention will now be described with reference to the attached drawings. In the following descriptions, a sensorless motor comprising: a rotor having a permanent magnetic field; and a stator having star-connected coils, which are arranged with a phase difference of 120° and in which phase ends are connected to a motor driving circuit, will be explained as an example of the electric motor relating to the present invention. Note that, the method of the present invention can be applied to a linear actuator, in which a movable member is reciprocally moved by an electric motor.

In the following descriptions, an example of a method for detecting permanent magnetic field location in a sensorless motor, e.g., three-phase brushless motor, will be explained with reference to a structure of a sensorless motor driving unit.

Figure 8:
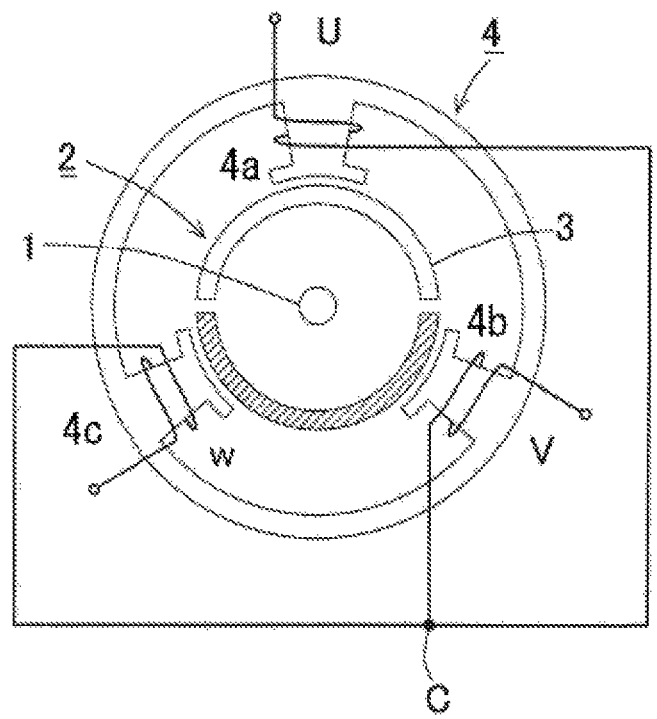
FIG. 8 shows a structure of a three-phase brushless DC motor, in which the coils are star-connected.

An example of the three-phase brushless DC motor relating to the present invention is shown in FIG. 8. For example, the three-phase brushless DC motor has a two-pole permanent magnet rotor 3 and a stator 4 having three slots. The motor may be an inner rotor type or an outer rotor type. Further, the permanent magnetic field may be an implanted permanent magnet (IPM) type or a surface permanent magnet (SPM) type.

In FIG. 8, the rotor 2 is integrated with a rotor shaft 1, and a two-pole permanent magnet 3 is provided thereto as a magnetic field. The stator 4 has pole teeth 4a, 4b and 4c, which face the permanent magnet 3 and which are arranged with a phase difference of 120°. Coils U, V and W are respectively formed on the pole teeth 4a, 4b and 4c of the stator 4, the phases are mutually star-connected at common C, and they are connected to the motor driving unit, which will be described later, as the three-phase brushless DC motor. Note that, a common line is not required, so it is omitted in the drawing.

Figure 3:
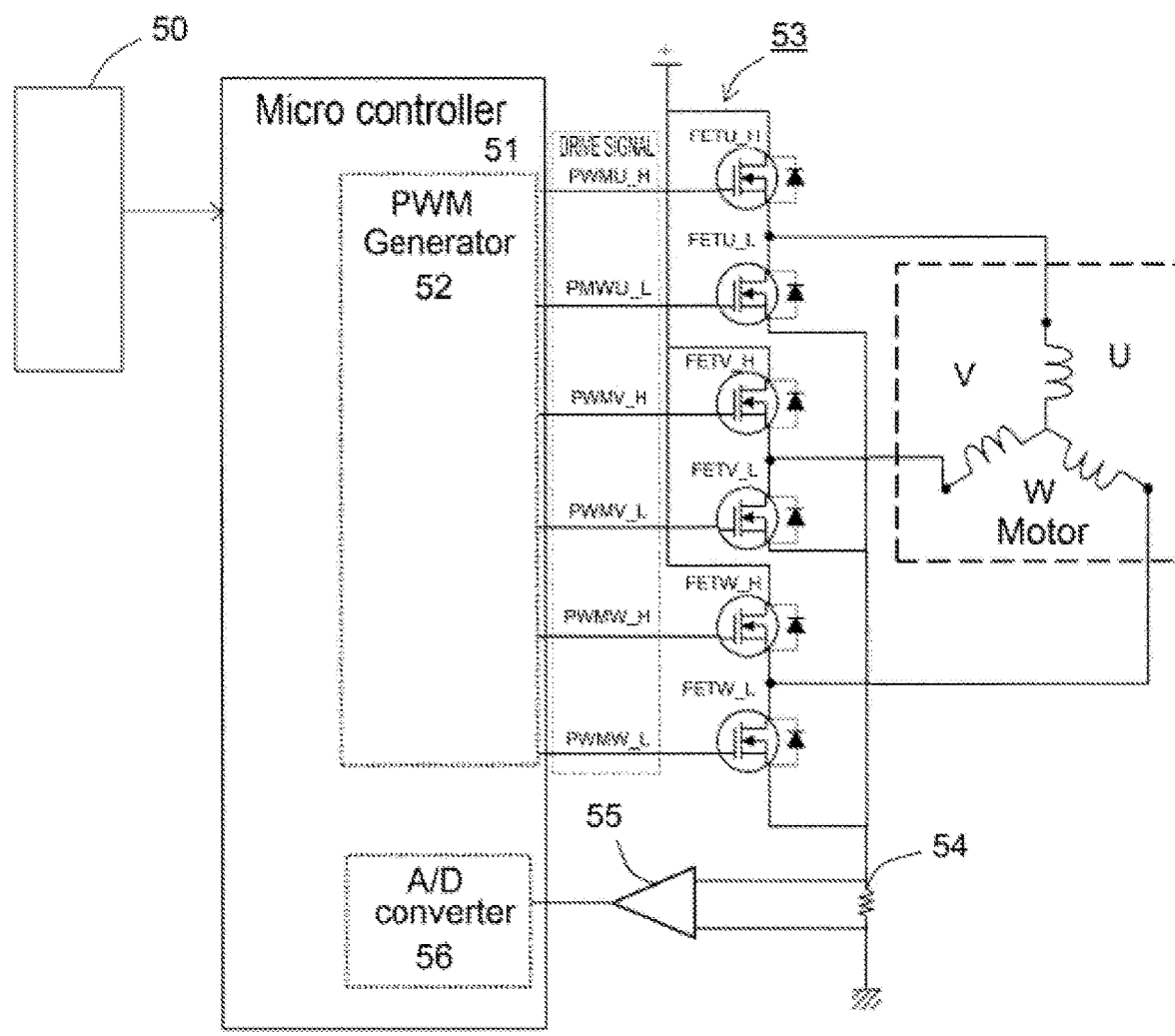
FIG. 3 is a block diagram of a motor driving circuit.

Next, an example of a motor driving circuit of the three-phase DC brushless motor is shown in FIG. 3.

An initiating manner of the motor is a 120°-energization bipolar rectangular-wave excitation manner.

MOTOR stands for the three-phase sensorless motor. An MPU 51 is a microcontroller (control means). The MPU 51 stores six energization patterns for the three-phase coils U, V and W and magnetic field location information for assigning excitation switching intervals (interval 1 to interval 6) of 120°-energization, which respectively correspond to the energization patterns, and has a PWM control circuit 52 for generating PWM energization signals for the three-phase coils U, V and W according to rotation commands sent from a superordinate controller.

As described above, the MPU 51 has the PWM control circuit 52. The PWM control circuit 52 sends the PWM energization signals (gate signals) and switching-controls a three-phase half-bridge type inverter circuit (INV: output means) 53 so as to energize optional two phase coils of the three-phase coils U, V and W. The three-phase half-bridge type inverter circuit 53 includes six gate circuits, in each of which a reflux diode is connected to a switching element (field-effect transistor FET) in parallel, for three phases. In the switching element of each phase, a high-side arm (e.g., FETU_H) is connected to a positive source line, and a low-side arm (e.g., FETU_L) is connected to an earth source line.

The PWM control circuit 52 controls each pair of the high-side arm (e.g., FETU_H) of the three-phase half-bridge type inverter circuit 53 and the low-side arm (e.g., FETU_L) thereof for each phase. For example, the PWM control is performed in a complementary mode in which the arm, which is an opposite side arm to the arm turned on during a PWM on-cycle energization period, is turned on during a PWM off-cycle period; and the PWM control is performed in an HL energization mode and an LH energization mode. Namely, the high-side arm is turned on (H) during the PWM on-cycle period, and the low-side arm is turned on (L) during the PWM off-cycle period (HL energization); and the low-side arm is turned on (L) during the PWM on-cycle period, and the high-side arm is turned on (H) during the PWM off-cycle period (LH energization).

An electric current sensor (RS: current detecting means) 54 is serially connected to a common earth terminal of the three-phase half-bridge type inverter circuit 53. The current sensor 54 is connected to an input terminal of a comparator (COMP) 55. In the present embodiment, a shunt resistance r is used as the current sensor 54. Output of the current sensor (current detecting means) 54 is sent to an A/D converter (ADC: Analogue-to-Digital Conversion circuit) 56. The A/D converter 56 measures coil current values from output of the current sensor 54. Elapse of a prescribed energization time of sensing pulse is measured by a built-in timer of the MPU 51. A high-performance A/D converter is not required, so an inexpensive one included in the MPU 51 may be sufficiently used. For example, a 12-bit A/D converter whose data acquisition time is 1 μs and a conversion time is about 20 μs is included in a generic MPU microprocessor unit, and it can be sufficiently used in the present invention. By using the above described structure, peak coil current values for six energization patterns of the three-phase energization are measured, the maximum pattern is detected from maximum measurement data, and a rotor location is identified from field location information corresponding to the maximum pattern, which has been previously stored in the MPU 51.

Figure 11:
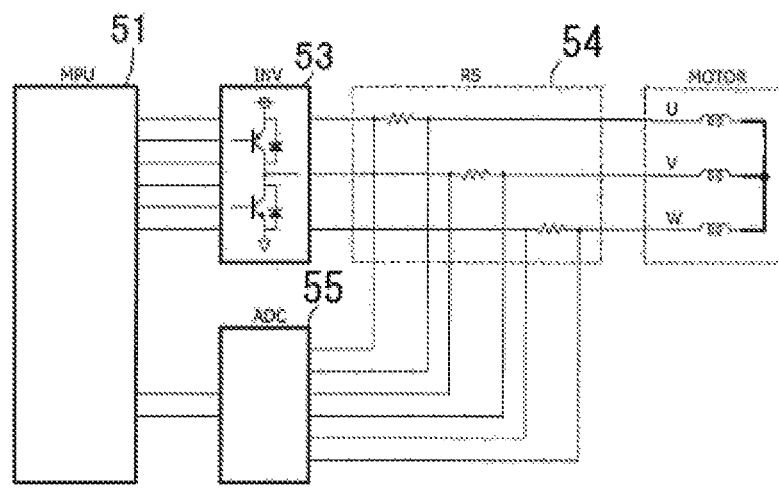
FIG. 11 is a block diagram of the conventional motor driving circuit.
Figure 12:
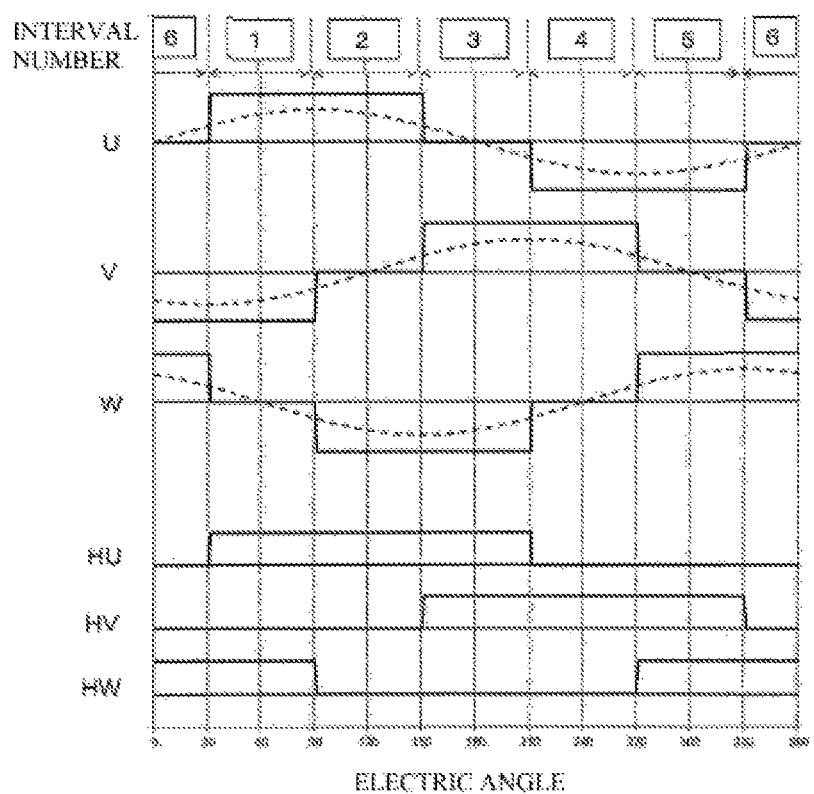
FIG. 12 is a timing chart of the 120°-energization.
Figure 13:
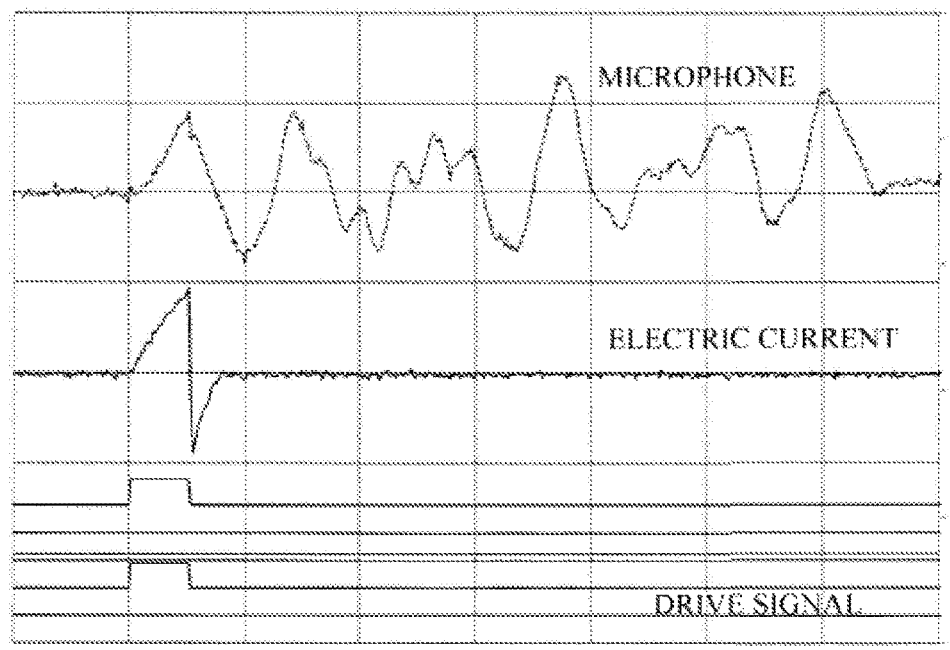
FIG. 13 is a waveform chart showing the waveform of the coil current and the waveform of the sound collecting microphone when applying one pulse of the drive signal (rectangular pulse) to the conventional motor driving circuit.

In the present embodiment, for sensing the rotor location, energizations to the three-phase coils are simultaneously turned on and off so as to detect peak currents. Thus, the current sensor 54 constituted by one shunt resistance r is provided between the common earth terminal of the three-phase half-bridge type inverter circuit 53 and the earth as shown in FIG. 3, instead of the current sensors of the conventional motor driving circuit, which are respectively serially connected to the coils as shown in FIG. 11. Only low voltage, e.g., several volts of voltage drop, is applied to the shunt resistance r, so it can be used in a high-voltage driving circuit whose coil-applying voltage is, for example, several hundred volts.

The comparator 55 compares a detected voltage corresponding to a coil current detected by the current sensor 54 with a reference voltage corresponding to a current threshold value and detects if the coil current reaches the current threshold value or not. Peak current values are detected by the A/D converter 56. The detected voltage outputted from the current sensor 54 is inputted to an input terminal of the comparator 55. The reference voltage, whose value is equivalent to the current threshold value capable of detecting variation of magnetoresistance caused by field polarity, is inputted to a reference terminal. Output of the A/D converter 56 is sent to the MPU 51, and it is changed from L-level to H-level when exceeding the current threshold value.

The MPU 51 measures the peak current values by using the A/D converter 56, stores measured data of an object coil to be measured for each phase and detects the permanent magnetic field location. Concretely, an object phase to be measured, in which one phase energization is performed through a neutral point, is selected from the three-phase coils, a forward-direction energization and a reverse-direction energization are performed for the object phase in this order, and the same energization patterns are repeated for the rest two phases, so that the six energization patterns are performed. Then, the maximum energization pattern whose measured data is maximum is detected from the measured data, and the rotor location is identified from the stored permanent field location information corresponding to the maximum energization pattern.

The theory of detecting the permanent field location will be explained.

When constant voltage pulses are applied to a coil, a coil current is increased by the following formula:

$$I(t)=(L/R)*(1-e^{(-t*R/L)})$$

wherein I is a coil current value, L is a coil inductance value, and R is a coil resistance value.

Figure 1:
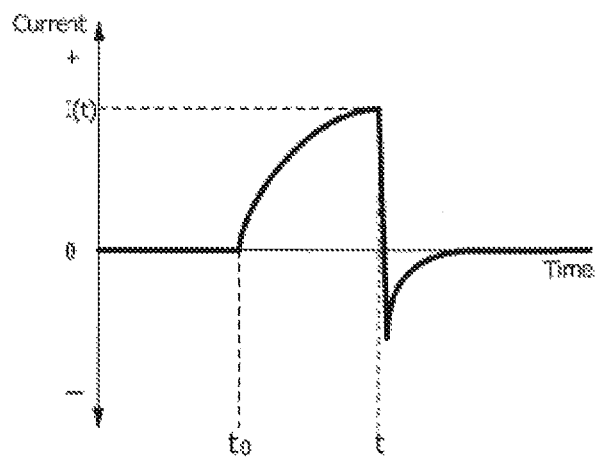
FIG. 1 is a waveform chart of one energization pattern.

A current waveform when applying a constant voltage rectangular-wave pulse to a coil is shown in FIG. 1.

R is constant. If a pulse time t is a prescribed value, the peak current value I(t) reflects the inductance L.

Six three-phase energization patterns applied to the three-phase motor are shown in TABLE 1.

TABLE 1

| Pattern Number | Phase Connected to Positive-side of Electric Source | Phase Connected to Earth-side |
|---|---|---|
| 1 | U | V, W |
| 2 | V, W | U |
| 3 | V | W, U |
| 4 | W, U | V |
| 5 | W | U, V |
| 6 | U, V | W |

Figure 2:
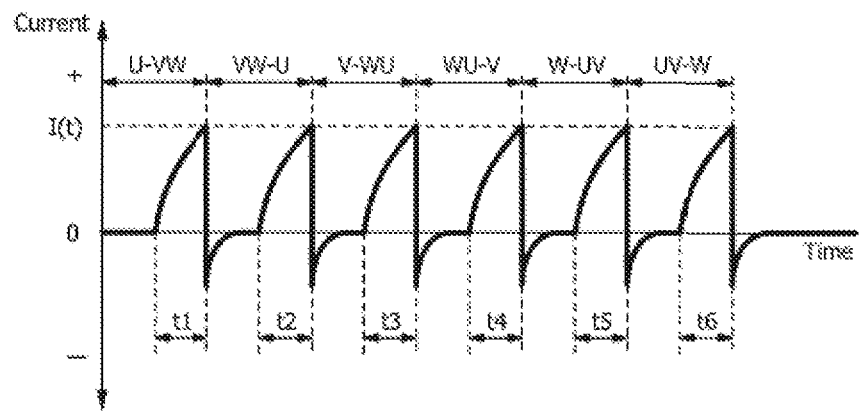
FIG. 2 is a waveform chart showing current waveforms when measuring six energization patterns.

Output off-periods are set for each of the three-phase coils to produce a coil current zero sate therefor. In the coil current zero state, when the six energization patterns are sequentially selected and a high-frequency constant voltage rectangular-wave pulse is sequentially applied, the current waveform is shown in FIG. 2. In the above described manner, the rotor location is detected by sensing pulses, and the peak current values are measured under a condition where the pulse time t is a prescribed constant value.

The manner for measuring peak current values, in which the pulse time t is the prescribed constant value, will be explained. A current increasing rate is large at a location where inductance is small; a current increasing rate is small at a location where inductance is large. Therefore, current variation according to the rotor location is opposite to pulse time variation when the peak current is constant. When applying short time pulses, peak current values I1-I6 are varied according to the magnetic field locations due to influence of reluctance. The peak current variation with respect to the magnetic field location has two-periodicity, and that for one phase approximates the following formula:

$$\Delta Ia = \cos 2\theta, \cos(2\theta+\pi)$$

wherein θ is the magnetic field location.

The peak current variations of the rest two phases can be obtained by adding 120° to θ and subtract 120° from θ.

When applying long time pulses, magnetic resistance is varied by magnetic field polarity, so the peak currents I1-I6 are varied according to the magnetic field locations. The current variation with respect to the magnetic field locations has one-periodicity, and that for one phase approximates the following formula:

$$\Delta Ib = \cos 2\theta, \cos(2\theta+\pi)$$

wherein θ is the magnetic field location, and ΔIb=1 when θ is from 0 to π/2 and from 3π/2 to 2π.

The peak current variations of the rest two phases can be obtained by adding 120° to θ and subtract 120° from θ.

It is thought that both of reluctance variation and magnetic resistance variation reflect to coil current when long time pulses are applied, so the current variation approximates ΔI=ΔIa+ΔIb.

Figure 4:
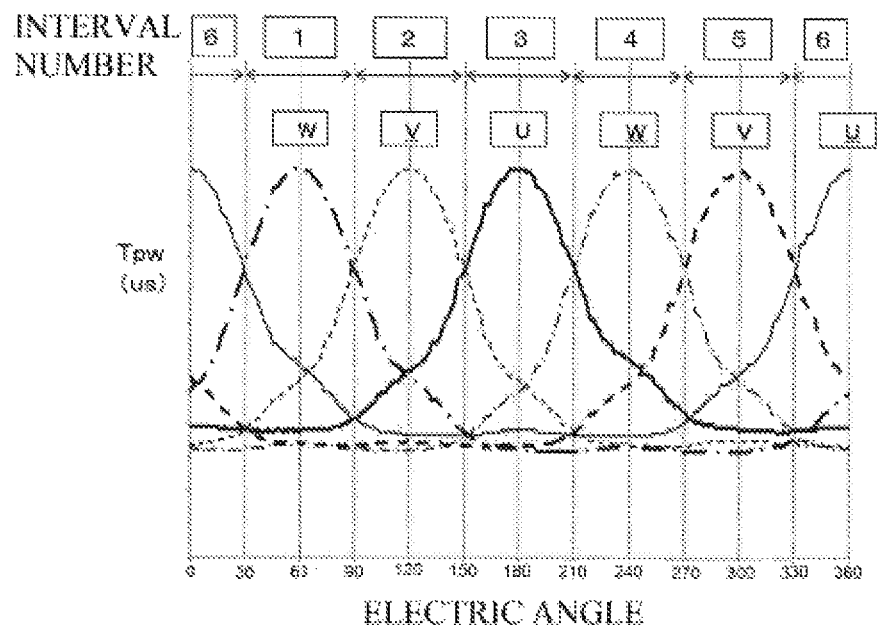
FIG. 4 is an actual waveform chart of electric current values passing through three-phase coils.

Actual waveforms of the current variations when applying long time pulses are shown in FIG. 4. Pulses of the prescribed time are applied to each of the six energization patterns and peak current values are measured every 1°, so 2160 data are plotted. A used motor is a spindle motor for driving a hard disc. Note that, for example, in FIG. 4, W indicates forward-direction energization, and W indicates reverse-direction energization.

As clearly shown in FIG. 4, the energization pattern whose peak current value is maximum is switched with a 60° pitch corresponding to an excitation interval of the 120°-energization. Therefore, if the energization pattern whose peak current value is maximum is detected, the rotor location can be uniquely determined, so that the motor can be initiated by the 120°-energization.

Relationships between the maximum energization patterns and the magnet field location information are shown in TABLE 2. For example, the maximum energization pattern "W-UV" indicates that the W-phase is connected to the positive-side electric source and that the U-phase and the V-phase are connected to the earth-side (negative-side). Corresponding excitation patterns of the 120°-energization are added for reference. The rotor is rotated in the forward direction by energizing two phases with the written excitation pattern, and the motor is rotated in the reverse direction by reversely energizing.

TABLE 2

| Maximum Energization Pattern | Magnetic Field Location Information (Electric Angle) | 120°-Excitation Pattern |
| --- | --- | --- |
| W-UV | 30°~90° | U-V (Interval 1) |
| UW-V | 90°~150° | U-W (Interval 2) |
| U-VW | 150°~210° | V-W (Interval 3) |
| VU-W | 210°~270° | V-U (Interval 4) |
| V-WU | 270°~330° | W-U (Interval 5) |
| WV-U | 330°~30° | W-V (Interval 6) |

A concrete manner for identifying the permanent magnetic field location (rotor location) will be explained with reference to TABLE 2.

In a stationary state, energizations are respectively performed, for the six three-phase energization patterns, for a constant time, and peak current values are measured. Order of the energization patterns is pursuant to TABLE 1.

If the peak current value of U-VW energization is maximum, the magnetic field location is identified as being in an interval between 150° and 210° from TABLE 2. By performing V-W excitation, in which the V-phase is connected to a plus-side of an electric source and the W-phase is connected to an earth-side, with the 120°-energization, the motor is initiated to rotate in the forward direction; by performing the opposite excitation, i.e., W-V excitation, the motor is rotated in the reverse direction. By employing this method, the permanent magnetic field location (rotor location) can be highly easily identified.

Further, the rotor location can be precisely identified at a pitch of an electric angle of 30°.

By magnitude-comparing the measured data of the energization patterns, which are adjacent to the maximum energization pattern whose peak coil current value is maximum, with each other, the permanent magnetic field location in units of an electric angle of 30° can be identified by dividing the field location information of an electric angle of 60° identified from the maximum energization pattern. By identifying the magnetic field location, the maximum energization pattern in the adjacent interval can be identified from TABLE 2. For example, in case that the W-UV pattern is maximum, the rotor location is in an interval 1 (30°-90°), so the maximum energization pattern in a forward interval (330°-30°) is WV-U, and the maximum energization pattern in a backward interval (90°-150°) is UW-V.

Therefore, a cross point of energization times of two phase coils exists at a center of an interval of the permanent magnetic field location identified at an electric angle of 60°, and the magnitude relation is inverted, so that the rotor location can be precisely identified in units of an electric angle of 30° by magnitude-comparing the measured data of both of the maximum energization patterns adjacent to each other. Required data have already obtained, so new measurement is not required.

In the above described method, the magnetic field location can be identified in not only the stationary state but also a state of rotating at a low speed. When rotating the rotor, the rotor location has been already identified, so the sensing need not be performed for the six patterns, and the rotation can be continued by only detecting a next excitation switching point. The present energization is continued until detecting the next excitation switching point, and an excitation sequence may be advanced when detecting the excitation switching point.

Profiles of the measured data intersect with each other at an excitation switching point. Therefore, the excitation switching point can be detected by periodically performing the sensing in two energization patterns of the present interval and an adjacent interval in the rotational direction and magnitude-comparing the obtained two measured data with each other. For example, in case that the rotor is located in the interval 1 (30°-60°), the energization pattern of the present interval is identified as W-UV energization from TABLE 2. Further, if the rotor is rotated in the forward direction, the energization pattern of the adjacent interval 2 in the rotational direction is identified as UW-V energization. By performing the sensing in those two patterns, the magnitude relation of the measured data is inverted when the rotor location exceeds 90°. Therefore, it is detected that the rotor reaches the interval 2, so the excitation pattern is advanced at this moment. The motor can be seamlessly initiated, a low-speed rotation can be continued, or stall torque can be continuously generated by similarly continuously detecting the excitation switching points and advancing the excitation patterns.

It is necessary to make the sensing time short as much as possible, but the six energization patterns in the stationary state become two energization patterns, and measurement time can be shortened in ⅓ by employing the above described sensing manner. The measurement time is varied according to conditions of the motor and the driving circuit, and it is about 300 μs.

Further, by performing the measurement for three energization patterns, the rotational direction of the rotor can be identified. The sensing is periodically performed with three energization patters corresponding to the present interval, the adjacent interval in the forward rotational direction and the adjacent interval in the reverse rotational direction, and the magnitude-comparison is performed between the measured data so as to detect a next boundary point between the excitation intervals in the forward rotational direction or the reverse rotational direction, so that the rotational direction can be identified from the boundary point detected first.

In TABLE 2, if the rotor is located in, for example, the interval 1 (30°-90°), the excitation boundary point in the forward direction is 90°, and it is the cross point of the W-UV energization pattern and the UW-V energization pattern. Similarly, the excitation boundary point in the reverse direction is 30°, and it is the cross point of the W-UV energization pattern and the WV-U energization pattern. If the forward-side cross point (90°) is detected earlier than the reverse-side cross point (30°), it is detected that the rotor is rotated in the forward direction. Similarly, if the reverse-side cross point (30°) is detected earlier than the forward-side cross point (90°), it is detected that the rotor is rotated in the reverse direction. Therefore, by periodically performing the sensing with the three energization patterns for the present interval, the adjacent interval on the forward side and the adjacent interval on the reverse side, the excitation boundary points between the excitation intervals and the rotational direction can be identified.

With the above manner, there is no restriction relating to the rotational direction, so that the rotor can be rotated in the forward direction and the reverse direction. In case that the rotor is rotated by an external force too, the rotor location can be detected, and torque can be generated in an optional direction. Note that, by employing the above described sensing manner, the six energization patterns in the stationary state become three energization patterns, and measurement time can be shortened in ½.

Next, an example of the process of detecting the rotor location performed by the MPU 51 will be explained with reference to the block diagram of the motor driving circuit of FIG. 3 and the current waveform chart of FIG. 2.

The six three-phase energization patterns and the permanent magnetic field location information have been previously stored in a memory. Reference voltage corresponding to a prescribed current threshold value has been set to a reference terminal of the A/D converter 56. The MPU 51 is capable of initiating the detection of the rotor location, by performing the two-phase 120° rectangular-wave energization for the three-phase coils U, V and W through the three-phase half-bridge type inverter circuit 53, according to a rotation command from a superordinate controller 50. The three-phase half-bridge type inverter circuit 53 selects two phases from the three-phase coils U, V and W and energizes the two phases so as to bias the rotor in the rotational direction. The detection of the rotor location is initiated by the rotation command from the superordinate controller 50. When initiating the detection of the rotor location, the MPU 51 turns off the energizations of all of the three-phase coils and waits until the coil currents reach zero. With this manner, the coil current zero state is produced (Energization-off Step).

Successively, one energization pattern is sequentially selected from the six energization patterns on the basis of TABLE 1, constant voltage rectangular-wave pulses are applied to the three-phase coils U, V and W to initiate the sensing energization, and the MPU 51 waits, for a prescribed time, by using the built-in timer. When elapsing the prescribed time, the MPU 51 measures the coil peak current values from outputs of the current sensor 54 by using the A/D converter 56 and stores the measured data (Measurement Step). Then, the MPU 51 turns off the energizations of all the three-phase coils again and waits until the coil currents reach zero.

The MPU 51 selects the forward-direction energization and the reverse-direction energization for the object phase to be measured in this order, and selects the forward-direction energization and the reverse-direction energization for the rest two phases in this order, then the MPU 51 repeatedly measures the peak coil current values by turning off the energization and performing the sensing energization for the six energization patterns shown in TABLE 1 and stores the measured data. The MPU 51 selects the maximum energization pattern, whose measured datum is maximum, from the measured six data. Then, the MPU 51 selects the magnetic field location information corresponding to the maximum energization pattern from TABLE 2, then the permanent magnetic field location is identified from the selected magnetic field location information. Then, the detection of the rotor location is completed.

Especially, in the measurement step in which the sensing energization is performed by applying constant voltage rectangular-wave pulses to the three-phase coils U, V and W, at least a low-side arm of the three-phase half-bridge type inverter circuit 53, which works for reflux, is turned on so as to reflux an induced current between a field-effect transistor and the coil to attenuate the induced current, so that rapid variation of the motor current and generating noises can be restrained.

Figure 5:
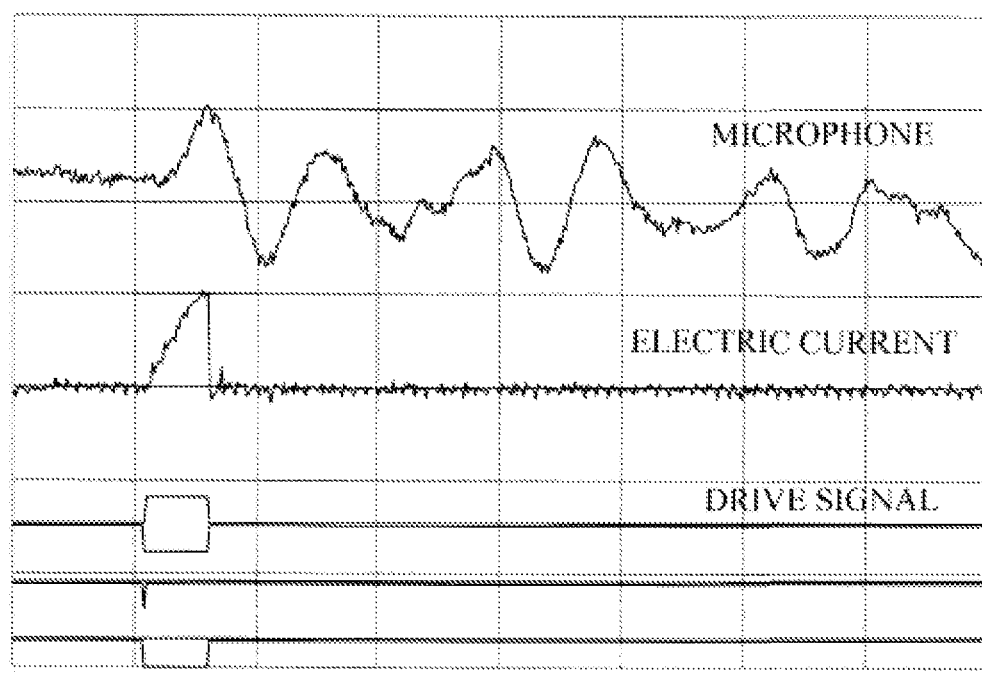
FIG. 5 is a waveform chart showing a waveform of a coil current and a waveform of a sound collecting microphone when applying one pulse of a drive signal (rectangular pulse) to the motor driving circuit shown in FIG. 3.
Figure 6:
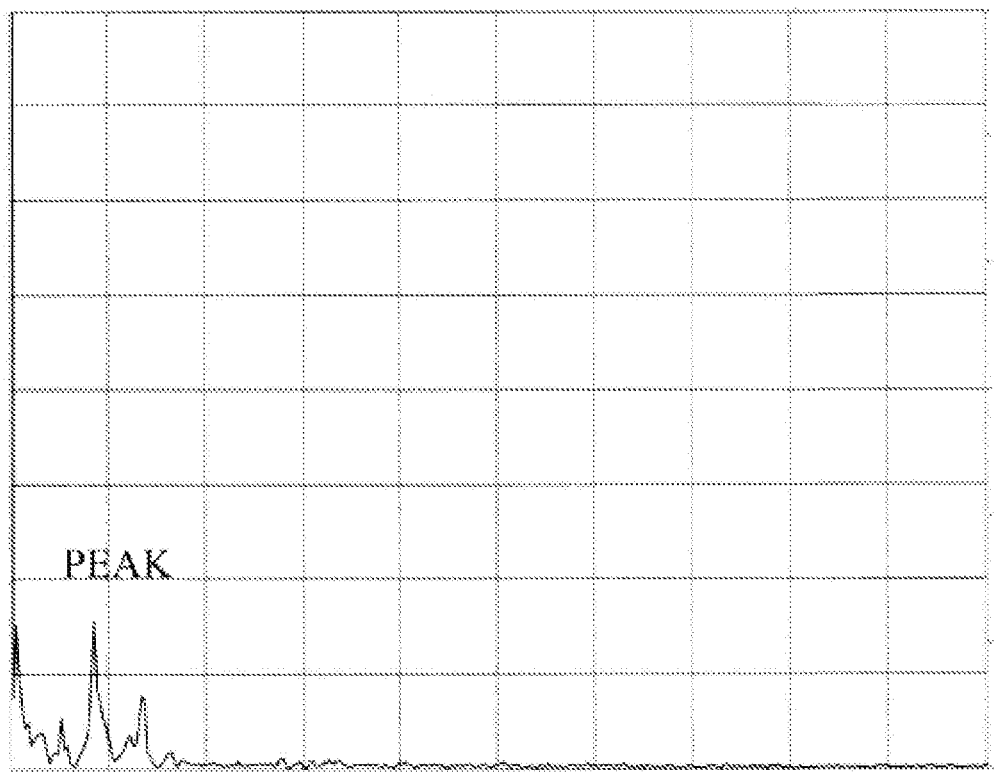
FIG. 6 is a waveform chart showing a waveform of the sound collecting microphone, which is FFT (Fast Fourier Trans formation)-treated.

The above described manner will be concretely explained. FIG. 5 is a waveform chart showing a waveform of a coil current and a waveform of noises collected by a sound collecting microphone when applying one pulse voltage (a drive signal) to optional two phase coils (e.g., U and V) of the three-phase coils U, V and W. FIG. 6 is a microphone waveform chart showing a waveform of the noises which is FFT (Fast Fourier Transformation)-treated. In FIG. 6, a vertical axis indicates magnitude of noise, and a horizontal axis is a time axis.

Figure 7:
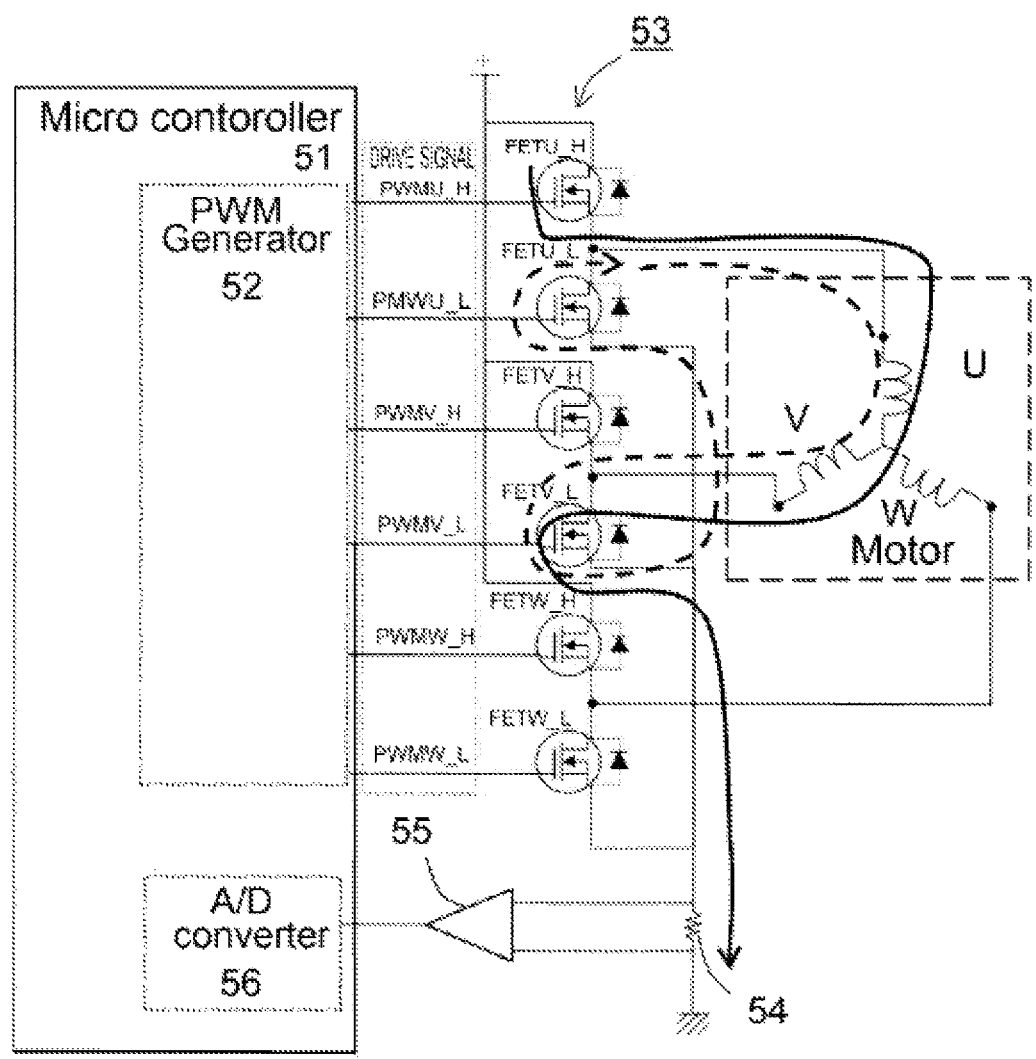
FIG. 7 is an explanation view showing flows of an energization current and an induced current in the motor driving circuit shown in FIG. 3.

In a motor driving circuit shown in FIG. 7, a solid line arrow shows a flow of an electric current passing through optional two coils (e.g., U and V) of the three-phase coils U, V and W when applying pulse voltage to the two coils, and a dotted line arrow shows a flow of an induced current generated after the energization.

Figure 10:
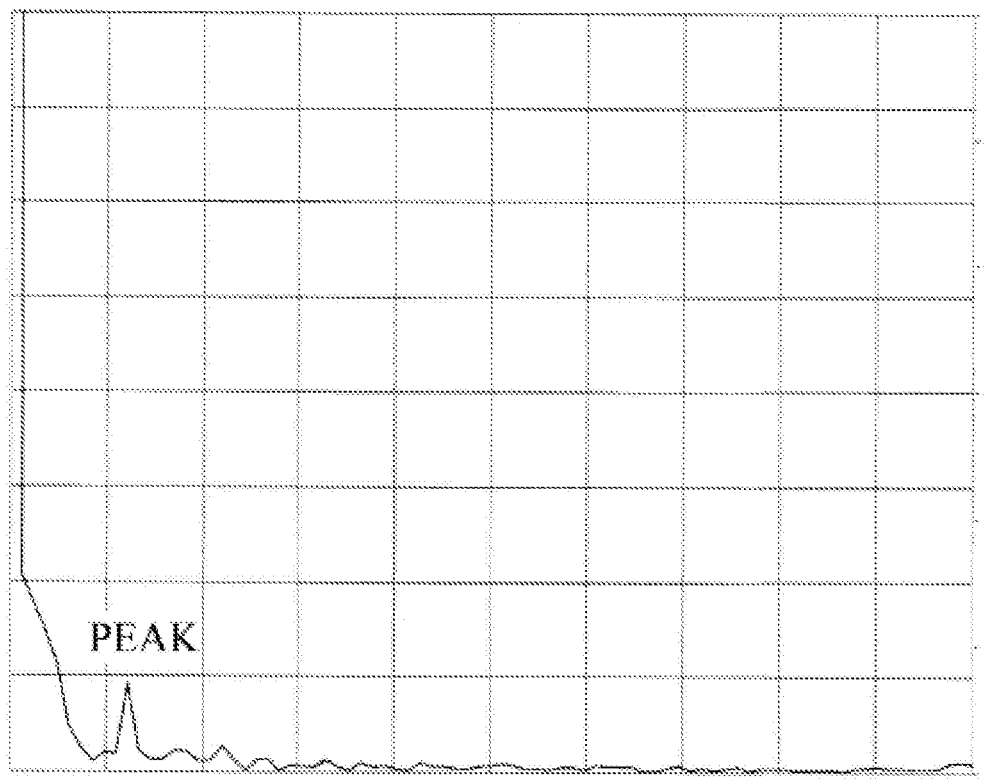
FIG. 10 is a waveform chart showing a waveform of the sound collecting microphone shown in FIG. 9, which is FFT (Fast Fourier Transformation)-treated.
Figure 14:
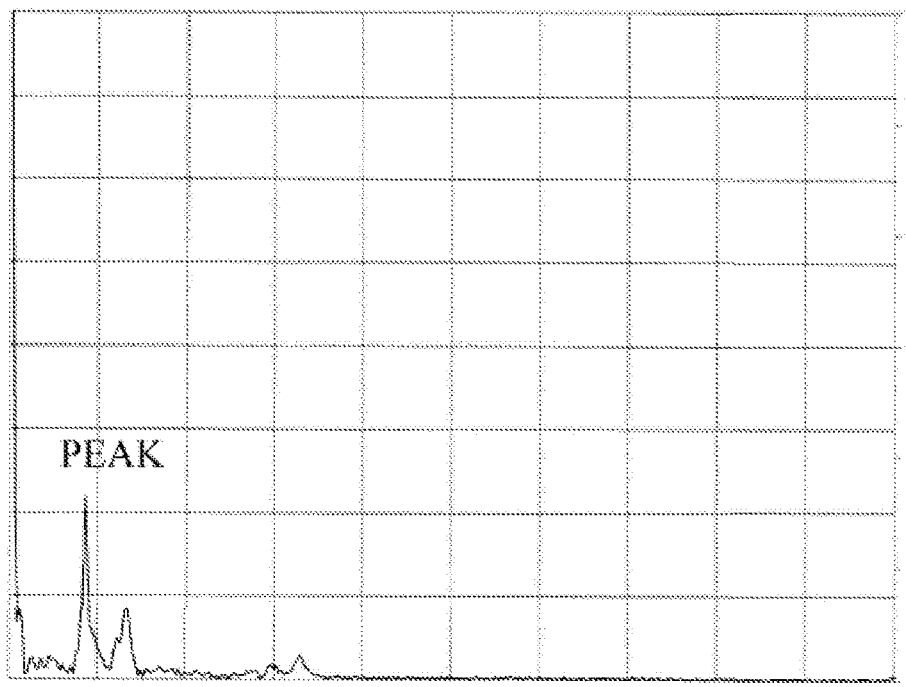
FIG. 14 is a waveform chart showing the waveform of the sound collecting microphone shown in FIG. 13, which is FFT (Fast Fourier Transformation)-treated.
Figure 15:
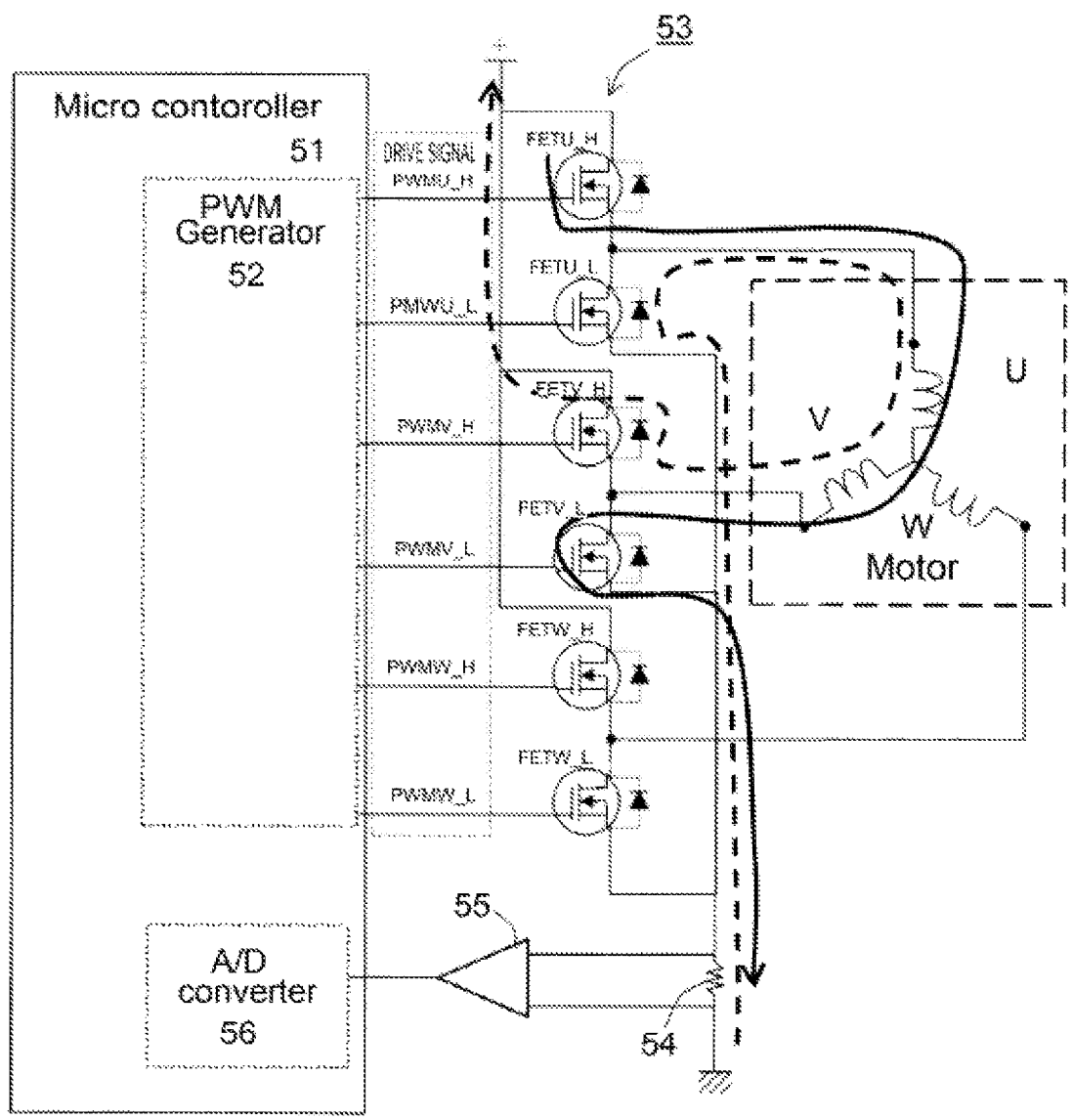
FIG. 15 is an explanation view showing the flows of the energization current and the induced current in the conventional motor driving circuit.

The coil current shown by the solid line arrow flows from FETU_H (U-phase FET high-side arm) to FETV_L (V-phase FET low-side arm) via the U-phase coil and the V-phase coil; the induced current shown by the dotted line arrow is refluxed to FETU_L (U-phase FET low-side arm) and FETV_L (V-phase FET low-side arm) via the V-phase coil and the U-phase coil in a state where at least the low-side arms for reflux is turned on. Note that, FETW_L (W-phase FET low-side arm may be turned on or off. Since the induced current is refluxed without passing a reflux diode and a resistance, variations of the currents passing through the three-phase coils U, V and W become slow, so a peak value of the noise shown in FIG. 6 is lower than that shown in FIG. 14. Note that, FIGS. 6, 10 and 14 show the microphone waveforms which are FFT (Fast Fourier Transformation)-treated. In the waveform charts, units are omitted, and scales of the horizontal axes (time axes) and the vertical axes (noise level axes) are same.

In the measurement step, when sequentially selecting one from the six energization patterns and applying constant voltage rectangular-wave pulses to the three-phase coils for the prescribed sensing energization time, the MPU 51 may apply divided constant voltage rectangular-wave pulses, which are divided by a manner of chopper-control performed by the PWM control circuit 52, may measure peak coil current values immediately before completing the sensing energizations performed by the A/D converter 56 and may store the measured data.

Figure 9:
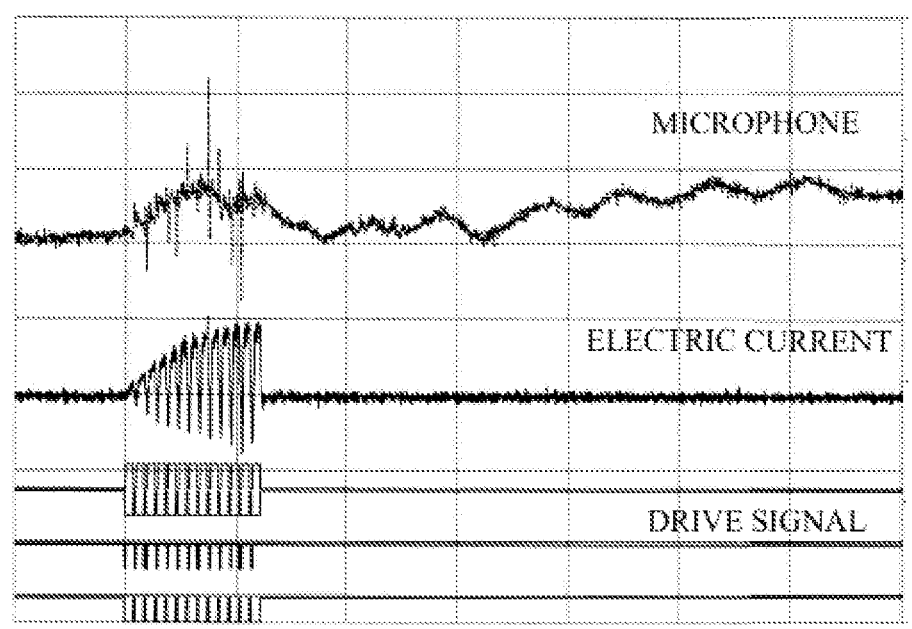
FIG. 9 is a waveform chart showing a waveform of a coil current and a waveform of a sound collecting microphone when applying one pulse of the drive signal (rectangular pulse) to the motor driving circuit shown in FIG. 3.

FIG. 9 is a waveform chart showing a waveform of a coil current and a waveform of noises collected by a sound collecting microphone when applying one pulse voltage (the drive signal) to optional two phase coils (e.g., U and V) of the three-phase coils U, V and W by the 120°-rectangular wave energization. The PWM control circuit 53 further finely divides one-pulse voltage shown in FIG. 5 and applies it as divided pulse voltage. FIG. 10 is a microphone waveform chart showing a waveform of the noises which is FFT (Fast Fourier Transformation)-treated. In FIG. 10, a vertical axis indicates noise level, and a horizontal axis is a time axis. It is confirmed that a peak value of the noise shown in FIG. 10 is lower than that shown in FIG. 6. By applying pulse voltages to the three-phase coils U, V and W with a prescribed time interval, it is thought that variations of the currents passing through the three-phase coils U, V and W become slow, and that amplitude of the microphone waveform is reduced. Therefore, rapid variation of the motor currents can be further restrained, and noises can be further reduced.

In the above described embodiments, the stator whose coils are star-connected, but a stator whose coils are delta-connected may be employed. Further, various kinds of motor driving circuits and control programs may be employed. The present invention is not limited to the above described embodiments, and modifications of circuit structures and programs, which can be easily performed by a person ordinarily skilled in the art (e.g., electronic circuit engineer, programmer), is included in the scope of the present invention.

What is claimed is:

1. A method for detecting a magnetic field location in an electric motor, the electric motor comprising: a rotor having a permanent magnetic field; and a stator having three-phase coils and being initiated by 120°-rectangular wave energization of a constant-voltage DC electric source, the electric motor driving circuit further comprising:
control means for storing six energization patterns, which are forward-direction energizations and reverse-direction energizations for the three-phase coils, and field location information indicating excitation switching intervals of 120°-energization corresponding to the energization patterns, the control means including a PWM control circuit for generating PWM energization signals for the three-phase coils according to a rotation command from a superordinate controller;
output means for energizing optional two coils of the three-phase coils, through a three-phase half-bridge type inverter circuit, by the PWM control circuit;
current detecting means for detecting coil currents, the current detecting means being connected to an earth-side terminal of the output means; and
an A/D-converter circuit for measuring coil current values from outputs of the current detecting means,
wherein the PWM control circuit controls each pair of a high-side arm and a low-side arm of the three-phase half-bridge type inverter circuit for each phase, and performs PWM control in a complementary mode, in which an opposite-side arm with respect to an energization time within a PWM cycle is turned on, during PWM-off cycles,
the control means repeats:
an energization-off step, in which the control means blocks all outputs of the output means immediately before sensing energization to the three-phase coils, and releases energies stored in all of the coils so as to produce a coil current zero state;
a measurement step, in which the control means sequentially selects one from the six energization patterns as an object phase to be measured which is selected from the three-phase coils and in which one-phase energization is performed and no branch is formed at a neutral point, applies constant voltage rectangular pulses to the three-phase coils for a prescribed sensing energization time, turns on at least the low-side arm of the three-phase half-bridge type inverter circuit so as to reflux an induced current between a switching element and the coil and attenuate the same, measures peak coil current values immediate before completing the sensing energization by the A/D-converter circuit, and stores the measured peak coil current values as measured data;
a storing step, in which the control means selects a reverse-direction energization pattern after a forward-direction energization pattern for the object phase, then selects a forward-direction energization pattern and a reverse-direction energization pattern for the rest two phases, repeats measurement of peak coil current values generated by energization-off actions and sensing energizations for the six energization patterns, measures peak coil current values immediately before completing the sensing energizations, and stores the measured data, and
the control means selects an energization pattern whose peak coil current value is the maximum among the measured data of the six energization patterns, and identifies a permanent magnetic field location from the field location information corresponding to the maximum energization pattern.

2. The method for detecting a magnetic field location in an electric motor according to claim 1,
wherein, in the measurement step, the control means applies constant voltage rectangular pulses, which have been divided by the PWM control circuit, to the object phase to be measured, when sequentially selecting one energization pattern from the six energization patterns and applying constant voltage rectangular pulses to the three-phase coils for the prescribed sensing energization time, and measures peak coil current values immediately before completing the sensing energizations by the A/D-converter circuit, and stores the measured peak coil current values as the measured data.

3. The method for detecting a magnetic field location in an electric motor according to claim 1,
wherein the control means halves field location information of an electric angle of 60° identified from the maximum energization pattern, by magnitude-comparing the measure data of the energization patterns adjacent to the energization pattern whose peak coil current value is maximum, so as to identify the permanent magnetic field location in units of an electric angle of 30°.

* * * * *